United States Patent [19]

Bigler et al.

[11] Patent Number: 4,760,440
[45] Date of Patent: Jul. 26, 1988

[54] PACKAGE FOR SOLID STATE IMAGE SENSORS

[75] Inventors: Robert R. Bigler, Moorestown; Samuel Goldfarb, Princeton, both of N.J.

[73] Assignee: General Electric Company, Schenectady, N.Y.

[21] Appl. No.: 547,217

[22] Filed: Oct. 31, 1983

[51] Int. Cl.$^4$ .................... H01L 23/02; H01L 23/12
[52] U.S. Cl. .................................... 357/74; 357/75
[58] Field of Search .................... 357/74, 75, 79, 80

[56] References Cited

U.S. PATENT DOCUMENTS

| | | | |
|---|---|---|---|
| 3,593,070 | 7/1971 | Reed | 317/234 R |
| 4,326,214 | 4/1982 | Trueblood | 357/74 |
| 4,406,054 | 9/1983 | St. Louis | 357/80 |
| 4,482,781 | 11/1984 | Burns | 357/74 |

Primary Examiner—William L. Sikes
Assistant Examiner—Robert E. Wise
Attorney, Agent, or Firm—William Squire; James C. Davis, Jr.; Paul R. Webb, II

[57] ABSTRACT

A package for solid state image sensor devices, such as CCD image sensors, includes a base plate on which a plurality of the image sensor devices are mounted in end-to-end abutting relation with the detector arrays of the image sensors being over an opening in the base plate, and a cover mounted on the base plate and extending over the image sensor devices to enclose the image sensor devices between the cover and the base plate. The base plate and cover are of polycrystalline silicon so as to have a coefficient of thermal expansion which matches that of the image sensor devices.

7 Claims, 2 Drawing Sheets

PACKAGE FOR SOLID STATE IMAGE SENSORS

The present invention relates to a package for solid state image sensors, such as CCD image sensors, and, more particularly, to a package which contains a plurality of CCD image sensors mounted in close relationship.

BACKGROUND OF THE INVENTION

There has been recently developed a CCD image sensor which provides an image from the detection of infrared radiation. Such a device is described in the article of H. Elabd et al., entitled "High Density Schottky-Barrier Infrared Charge-Couple Device (IRCCD) Sensors for Short Wave Length (SWIR) Applications at Intermediate Temperatures", published in SPIE Vol. 345, Advanced Multi-Spectral Remote Sensing (1982) pages 161-171. In general, these devices include a substrate of single crystalline silicon having formed therein and thereon an array of Schottky-barrier detectors coupled to a charge couple device. In order to protect the CCD image sensors from physical damage and from contaminents in the surrounding environment, it is the practice to place the device in a package which includes an opening through which the detector section of the device is exposed to the object to be sensed. Also, to permit detecting larger object areas, it is desirable to mount a plurality of the devices in the package.

When mounting a plurality of devices in a package, it is desirable to have the devices as close to each other as possible, preferably abutting each other, so that there are no gaps in the image sensed by the overall device. However, this raises problems since if the individual devices are mounted on a base of a package, any variations in the coefficient of thermal expansion of the base with regard to that of the individual devices can cause the devices to either separate from each other or engage each other upon changes in the temperature of the overall package. Also, such differences in the coefficient of thermal expansion could induce undesirable strains in the mechanical and electrical connections between the individual devices and the package base. In addition, the package base should have the characteristics of
  (1) being a good conductor of heat,
  (2) being capable of masking radiation from undesired sources,
  (3) be light in weight,
  (4) be sufficiently strong to protect the devices from mechanical damage, and
  (5) be capable of carrying interconnecting electrical conductors.

SUMMARY OF THE INVENTION

A package for solid state image sensors includes a base of silicon having a flat surface and an opening therethrough. A plurality of CCD image sensor devices are mounted on the flat surface of the base in close proximity to each other. Each of the image sensor devices includes a silicon substrate having an array of detectors thereon. The image sensors are mounted on the base with the detector array being exposed through the opening therein. A cover is mounted on the base and extends over the image sensor devices to enclose the image sensor devices.

DETAILED DESCRIPTION OF A PREFERRED EMBODIMENT

Figure 1:
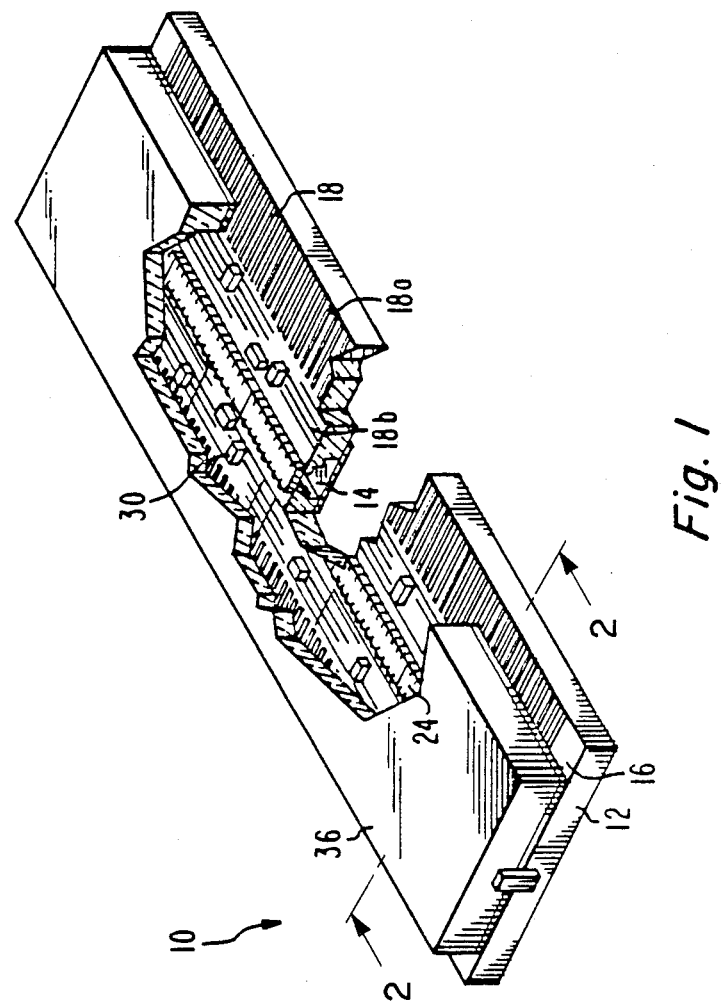
FIG. 1 is a perspective view, partially in section, of a form of the package of the present invention.
Figure 2:
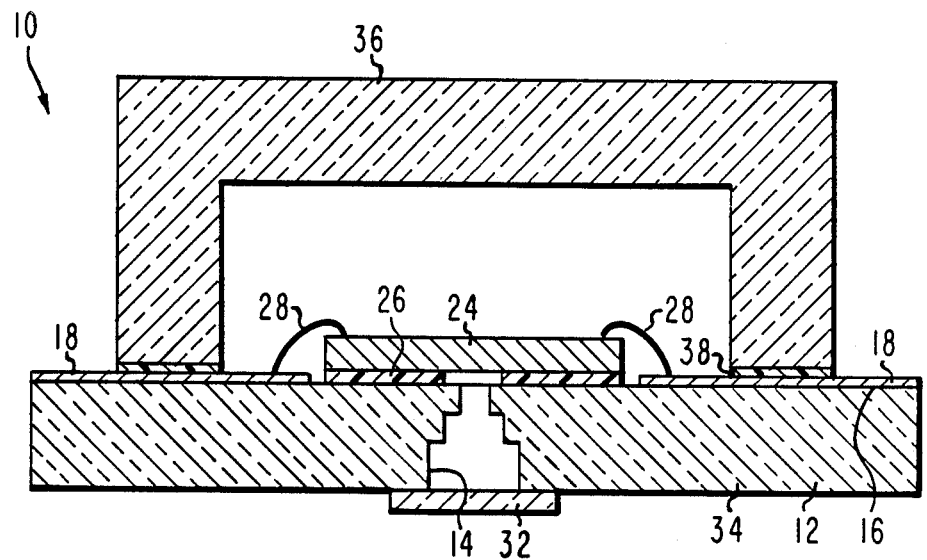
FIG. 2 is a sectional view taken along line 2—2 in FIG. 1.

Referring initially to FIG. 1, a form of a CCD image sensor package with incorporates the present invention is generally designated as 10. The package 10 includes a flat, rectangular base plate 12 of polycrystalline silicon. The base plate 12 has a narrow opening 14 therethrough which extends longitudinally along a portion thereof. On the inner surface 16 of the base plate 12 is a pattern of fine conductive lines 18. Some of the conductive lines 18a extend from the edges of the base plate 12 toward the opening 14 and other lines 18b extend essentially parallel to the opening 14 so as to cross the lines 18a. The lines 18b are electrically connected to various ones of the lines 18a. to define and interconnect pattern.

Figure 3:
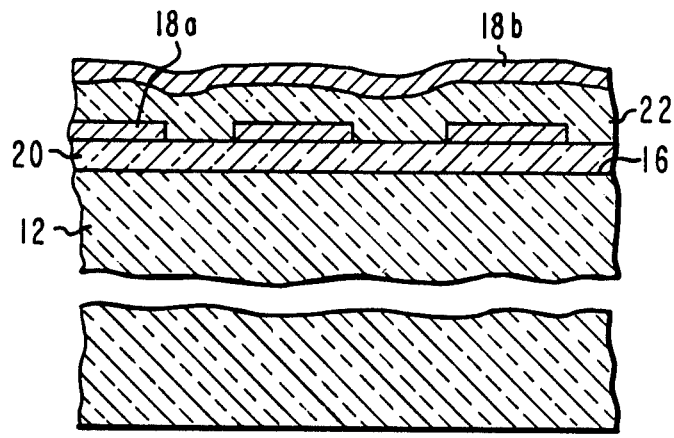
FIG. 3 is an enlarged sectional view of a portion of the base of the package.

Since some of the lines 18b may have to cross over some of the lines 18a, the lines may be formed on multi-levels as shown in FIG. 3. For a multi-level metallization pattern, the surface 16 of the substrate 12 may be first coated with a thin layer 20 of a dielectric material, such as a ceramic glaze. The lines 18a, which are of a good conductive material, such as gold, are then formed on the dielectric layer 20. The lines 18a may be of a thin film of the metal which is deposited on the dielectric layer 20 either by evaporation in a vacuum or sputtering. Alternatively, the lines 18a may be of a mixture of the metal particles in a suitable matrix which is screen printed on the dielectric layer 20 and then fired. A second layer 22 of a dielectric material is then coated over the lines 18a with openings provided in the second dielectric layer 22 where contact to a line 18a is to be made. The lines 18b, which are also of the conductive metal, are then formed on the second dielectric metal layer 22 using the same technique for applying the lines 18a. The lines 18b will pass through the opening in the second dielectric layer 22 to make contact with the lines 18a.

A plurality of CCD image sensor devices 24 are mounted on the surface 16 of the base plate 12. As previously described, each of the image sensor devices 24 includes a substrate of single crystalline silicon having an array of Schottky-barrier detectors and a CCD device formed therein. The image sensor devices 24 are mounted in end-to-end abutting relation with the detector arrays being over the opening 14 in the base plate 12. Each of the image detector devices 24 is secured to the surface 16 by a layer 26 of silver filled epoxy. The image sensor devices 24 are electrically connected to the conductive lines 18 by wires 28. If additional electrical components, such as capacitors and resistors, are required in the circuit with the image sensor devices 24, such components 30 in chip form can be mounted on the inner surface 16 and connected to the appropriate conductive lines 18.

A window 32 of a material which is transparent to infrared radiation, such as silicon, is mounted on the outer surface 34 of the base plate 12 and across the opening 14. The window 32 is secured to the base plate 12 by an epoxy cement. The window 32 is preferably coated with a suitable antireflection coating. Alternatively, the window 32 may be an integral part of the base plate 12.

A cover 36 of polycrystalline silicon is mounted on the surface 16 of the base plate 12 and extends over the image sensor devices 24 so that the image sensor devices 24 are enclosed between the cover 36 and the base plate 12. The cover is secured to the base plate 12 by a layer 38 of a suitable insulating cement, such as an epoxy filled with beryllia or alumina. The cover 36 is narrower than the base plate 12. Thus, portions of the line 18a project beyond the cover 36 so that suitable conductors, such as the conductors of ribbon cable, can be connected to the various conductive lines 18a.

Since the base plate 12 is of polycrystalline silicon, its coefficient of thermal expansion is almost the same as that of the silicon substrate of the CCD image sensor devices 26. Thus, variations in the temperature of the package 10 will not cause the CCD image sensor devices 24 to either separate, which would cause gaps in the image being sent, or to crash into each other, which could damage the sensor devices 26. Also, this prevents strains on the wires 28 connecting the image sensor devices 24 to the conductive lines 18. In addition, polycrystalline silicon is a good conductor of heat, is relatively light in weight and can have conductors formed thereon easily using standard semiconductor technology. While silicon is not considered an engineering structural material because its tensile strength decreases in cryogenic operating temperatures, it has ample strength, about 10,000 PSI tensile, for use as the base plate of this type of package. By making the cover 36 of polycrystalline silicon, its coefficient of thermal expansion matches that of the silicon base plate 12, this minimizes any stresses on the joint between the cover 36 and the base plate 12.

Thus, there is provided a package for CCD image sensor devices in which the image sensor devices can be mounted in end-to-end abutting relation and this relation will be maintained even under changes in the surrounding temperature. Also, the package provides good conduction of heat to and away from the CCD image sensor devices and protects them from physical damage as well as environmental contaminents.

Although the package 10 has been described as containing CCD image sensor devices, it can be used for any type of solid state image sensor having a detector area over the opening in the base plate.

What is claimed is:

1. A package for solid state image sensors comprising, a base plate of silicon having a flat surface and an opening therethrough,
   a plurality of image sensor devices mounted on said surface of the plate and in close proximity to each other, each of said image sensor devices including a silicon substrate having an array of detectors therein, said image sensor devices being mounted on the base plate with the detector array being exposed through said opening, and
   a cover mounted on said base plate and extending over said image sensor devices so as to enclose said image sensor devices between the cover and the base plate.

2. A package in accordance with claim 1 in which said cover is of silicon.

3. A package in accordance with claim 2 in which the base plate and cover are of polycrystalline silicon.

4. A package in accordance with claim 1 in which the base plate is a flat rectangular plate having an elongated opening therethrough.

5. A package in accordance with claim 4 in which the image sensor devices are mounted over said opening in end-to-end abutting relation.

6. A package in accordance with claim 5 in which the base plate has on said surface conductive lines and wires electrically connecting the image sensor devices to said conductor lines.

7. A package in accordance with claim 4 including a window secured to the outer surface of the base plate and extending across the opening, said window being of a material which is transparent to the radiation being sensed by the image sensor devices.

* * * * *